US006977862B2

(12) United States Patent
Schnabel et al.

(10) Patent No.: US 6,977,862 B2
(45) Date of Patent: Dec. 20, 2005

(54) ADDRESS DECODING CIRCUIT AND METHOD FOR ADDRESSING A REGULAR MEMORY AREA AND A REDUNDANT MEMORY AREA IN A MEMORY CIRCUIT

(75) Inventors: Florian Schnabel, Höhenkirchen (DE); Jens Polney, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/920,559

(22) Filed: Aug. 18, 2004

(65) Prior Publication Data

US 2005/0117416 A1 Jun. 2, 2005

(30) Foreign Application Priority Data

Aug. 19, 2003 (DE) ................ 103 38 022

(51) Int. Cl.⁷ ............................................. G11C 8/00
(52) U.S. Cl. ................ 365/230.06; 365/230.01; 365/200; 365/201; 365/230.03
(58) Field of Search ............ 365/230.06, 230.01, 365/200, 201, 230.03

(56) References Cited

U.S. PATENT DOCUMENTS

| 5,894,441 A | | 4/1999 | Nakazawa | |
| 6,134,177 A | * | 10/2000 | Kang | 365/230.06 |
| 6,570,793 B2 | * | 5/2003 | Stender | 365/200 |

FOREIGN PATENT DOCUMENTS

| DE | 695 00 007 T2 | 12/1996 |
| DE | 199 33 980 A1 | 3/2001 |
| DE | 100 02 139 A1 | 8/2001 |
| DE | 100 38 664 A1 | 2/2002 |

OTHER PUBLICATIONS

Tanabe, Akira; Takeshima, Toshio; Koike Hiroki u.a.: A 30-ns 64 Mb DRAM with Built-in Self-Test and Self-Repair Function, IEEE J. Solid-State Circuits, Nov. 1992, vol. 27, No. 11, pp. 1525-1531.
German Patent Office Examination Report dated May 26, 2004.

* cited by examiner

*Primary Examiner*—Richard Elms
*Assistant Examiner*—N. Nguyen
(74) *Attorney, Agent, or Firm*—Patterson & Sheridan, L.L.P.

(57) ABSTRACT

Address decoding circuit and method for addressing a regular memory area and a redundant memory area in a memory circuit are provided. One embodiment provides a method for addressing memory areas in a memory circuit with successive addresses, with either a regular memory area or a redundant memory area being addressed depending on the address, with an inactive state of a deactivation signal being set when addressing the regular memory area, which inactive state allows the addressing of the regular memory area, with the addressing of the regular memory area being blocked on the basis of an active state of the deactivation signal when addressing the redundant memory area, wherein a change is made from the active state of the deactivation signal to the inactive state of the deactivation signal before the application of the next address for addressing one of the memory areas.

20 Claims, 4 Drawing Sheets

ADDRESS DECODING CIRCUIT AND METHOD FOR ADDRESSING A REGULAR MEMORY AREA AND A REDUNDANT MEMORY AREA IN A MEMORY CIRCUIT

CROSS-REFERENCE TO RELATED APPLICATIONS

This application claims foreign priority benefits under 35 U.S.C. §119 to co-pending German patent application number 103 38 022.1, filed Aug. 19, 2003. This related patent application is herein incorporated by reference in its entirety.

BACKGROUND OF THE INVENTION

1. Field of the Invention

The invention relates to a method for addressing a memory area in a memory circuit. The invention also relates to an address decoding circuit for decoding an address for response (as a function of the address) of a regular memory area or of a redundant memory area. The invention furthermore relates to an integrated circuit having an address decoding circuit.

2. Description of the Related Art

In addition to regular memory circuits, integrated memory circuits generally have redundant memory areas which can be connected by cutting through or not cutting through fuses after completion of the processing of the wafer. Each redundant memory area has an associated fuse memory unit with a number of fuses, in which the address of the regular memory area to be replaced can be coded.

When a data access is made, if an address is applied which is coded in the fuse memory unit for a redundant memory area, then two signals are produced from the comparison of addresses and of the address information which is set in the fuse memory unit. Firstly, the redundant memory area which is associated with the corresponding fuse memory unit is activated on the basis of a redundancy activation signal for the current data access, and secondly, the activation of the regular memory area to be replaced is prevented. This is normally achieved with the aid of a deactivation signal which, for example, uses a switch to prevent the regular memory area from being driven (for example, preventing the activation of the corresponding word line).

The check to determine whether the applied address corresponds to the address stored in the fuse memory unit requires a longer time period than the processing of the address signals for addressing the regular memory areas. The evaluation of the redundancy information thus represents a critical path because the signal path through the redundant address decoder that is formed with the aid of the fuse memory element takes longer than the signal path through the regular address decoder. A delay element must therefore be provided such that the activation of an associated driver circuit for addressing the regular and redundant memory areas which are addressed by the address takes place a specific time period after the deactivation signal. If the deactivation signal indicates only after the activation of the delayed access signal that the regular memory area should not be activated, then the incorrect regular memory area will be activated for a short time, which leads to increased power consumption and/or to the memory circuit behaving incorrectly.

In the past, the critical path delay has been minimized as much as possible. However, both the rising edge and the falling edge of the deactivation signal must be set as well as possible, which always represents a compromise, since separate optimization of the rising edge and of the falling edge would lead to better solutions.

SUMMARY OF THE INVENTION

One aspect of the present invention provides a method and an apparatus by means of which the process of addressing a memory area in a memory circuit with regular and redundant memory areas can be accelerated.

According to a first aspect of the present invention, a method is provided for addressing memory areas in a memory circuit with successive addresses. A regular memory area or a redundant memory area is addressed, depending on the applied address. When addressing the regular memory area, an inactive state of a generated deactivation signal is set, which allows the addressing of the regular memory area. When addressing the redundant memory area, the addressing of the regular memory area is blocked on the basis of an active state of the deactivation signal. A change is made from the active state of the deactivation signal to the inactive state of the deactivation signal before the application of the next address for addressing one of the memory areas.

The method according to one embodiment of the invention has the advantage that the time period between the application of an address of a memory area to be addressed and the provision of the corresponding memory control signal for a redundant memory area or for a regular memory area can be shortened. According to one embodiment of the invention, provision is made for the signal path for generation of the deactivation signal to be optimized only with respect to a first edge from the inactive state to the active state while a second edge from the active state to the inactive state is ignored in the optimization process. Initially, this means that the edge from the active state to the inactive state is subject to a considerably longer signal delay with respect to the application of the corresponding address than the edge between the inactive state and the active state.

Since the respective memory area control signal is activated on the basis of an access signal, the access signal would have to be delayed (on the basis of the method according to the prior art) by a time period until the state of the deactivation signal associated with the respective address had been generated. One embodiment of the invention therefore provides that an active state of the deactivation signal, which may possibly exist, is changed back to the inactive state before the application of the next address, so that the access signal now need be optimized only on the basis of the signal delay time of the first edge of the deactivation signal.

In another embodiment, the regular or redundant memory area may be addressed on the basis of a driven memory area control signal. The driven memory area control signal is generated as a function of an access signal, of the applied address and/or of the deactivation signal.

The change from the active state of the deactivation signal to the inactive state of the deactivation signal on the basis of the second edge may be carried out approximately in the center of the time period between the application of two successive addresses. In this way, this "resetting" of the deactivation signal takes place approximately after half the time period between the addressing of a second address and the addressing of the next address. Thus, the deactivation signal will necessarily be in the inactive state when the next address is applied, so that the access to a regular memory area cannot be blocked by the access signal.

The change from the active state of the deactivation signal to the inactive state of the deactivation signal may be carried out on the basis of a control signal which is provided. The control signal can be produced such that a signal edge indicates the point in time before the application of the next address. In particular, it is possible to provide for the addressed memory area to be addressed by every alternate rising or every alternate falling clock edge, while no memory area is addressed, and the control signal is generated as a function of the respective intermediate clock edge. This method is suitable, for example, for addressing memory areas in a double data rate II (DDR II) memory circuit, in which a memory area cannot be addressed with each clock edge, but only with every alternate clock edge, or after two or more clock edges. The control signal for "resetting" the deactivation signal is generated as a function of the intermediate clock edge or as a function of one of the intermediate clock edges. Thus, it is possible to ensure that the deactivation signal is reset before the next address is applied.

Alternatively, another embodiment provides for a change to be made from the active state of the deactivation signal to the inactive state of the deactivation signal when a coded address value which is known to be a memory area that is not faulty is provided as the address. The control signal may be generated to reset the deactivation signal by comparison of the coded address value with an address which is defined in the redundant address decoder. Thus, there is no need for a further address line in order to generate the control signal.

According to a further aspect of the present invention, an address decoding circuit is provided for decoding an address and for response, which is dependent on the address, of a regular memory area or of a redundant memory area. The address decoding circuit may have an address data input to receive an applied address. It also has an address memory for storage of an incorrect address. Memory area activation lines are provided in order to address an appropriate redundant memory area when an address is applied which is identical to a faulty address that is stored in the address memory. A deactivation signal output is provided to output a deactivation signal which allows addressing of the regular memory area in an inactive state and blocks addressing of the regular memory area in an active state. The address decoding circuit may have a control connection in order to change the deactivation signal from an active state to an inactive state as a function of an applied control signal.

The address decoding circuit according to one embodiment of the present invention has the advantage that the deactivation signal can be reset to the inactive state with the aid of the control connection and on the basis of a control signal, such that deactivation of the memory area activation lines for addressing the respective memory area need not be delayed as a function of the edge from the active state to the inactive state of the deactivation signal. The delay of the deactivation signal is thus only the delay between the application of the address and the provision of the edge between the inactive state and the active state of the deactivation signal in the situation where a redundant memory area is intended to be addressed.

According to a further aspect of the present invention, an integrated circuit having an address decoding circuit as such is provided. The address decoding circuit has logic circuits to provide functions so that an appropriate memory area may be addressed on the basis of the applied address and such that a deactivation signal is generated. The logic circuits may be chosen such that the time taken for the signal to pass through the address decoding circuit is minimized with respect to the falling edge when the inactive state of the deactivation signal is a high state and the active state of the deactivation signal is a low state or with respect to the rising edge when the inactive state of the deactivation signal is a low state and the active state of the deactivation signal is a high state.

An additional address line in the integrated circuit may be connected to the control connection of the address decoding circuit to provide the control signal as a signal on the additional address line. In this way, the deactivation signal may be reset by provision of the appropriate control signal on the additional address line.

A buffer may be provided, to which the address can be applied, with the buffer accepting the address which is applied to the buffer on the basis of a first access signal and applying it to the address decoding circuit. The buffer may also be designed to read a predetermined coded address data item on the basis of a second access signal which is provided, and apply the read data to the address decoding circuit. The address decoding circuit changes the deactivation signal from the active state to the inactive state when the predetermined coded address data item is applied, which is selected such that no redundant memory area is addressed. The deactivation signal is reset, since the deactivation signal assumes the inactive state with the coded address data item. The relevant address is read as a coded address data item to the buffer by means of the second access signal and is thus applied to the address decoding circuit.

An access control unit may be provided to generate the first and the second access signal for the buffer on the basis of a clock signal. The access control unit generates the edge of the first and of the second access signal, for which the buffer accepts the respective address, offset with respect to one another, and in each case at an interval of two clock periods. This allows the control signal to be generated in a DDR memory module in which successive addresses are stored at an interval of at least two clock cycles, and the clock period, which in each case occurs between two clock periods may be used to generate the control signal.

BRIEF DESCRIPTION OF THE DRAWINGS

Preferred embodiments of the invention will be explained in more detail in the following text with reference to the attached drawings. In the figures.

DETAILED DESCRIPTION OF THE PREFERRED EMBODIMENT

Figure 1:
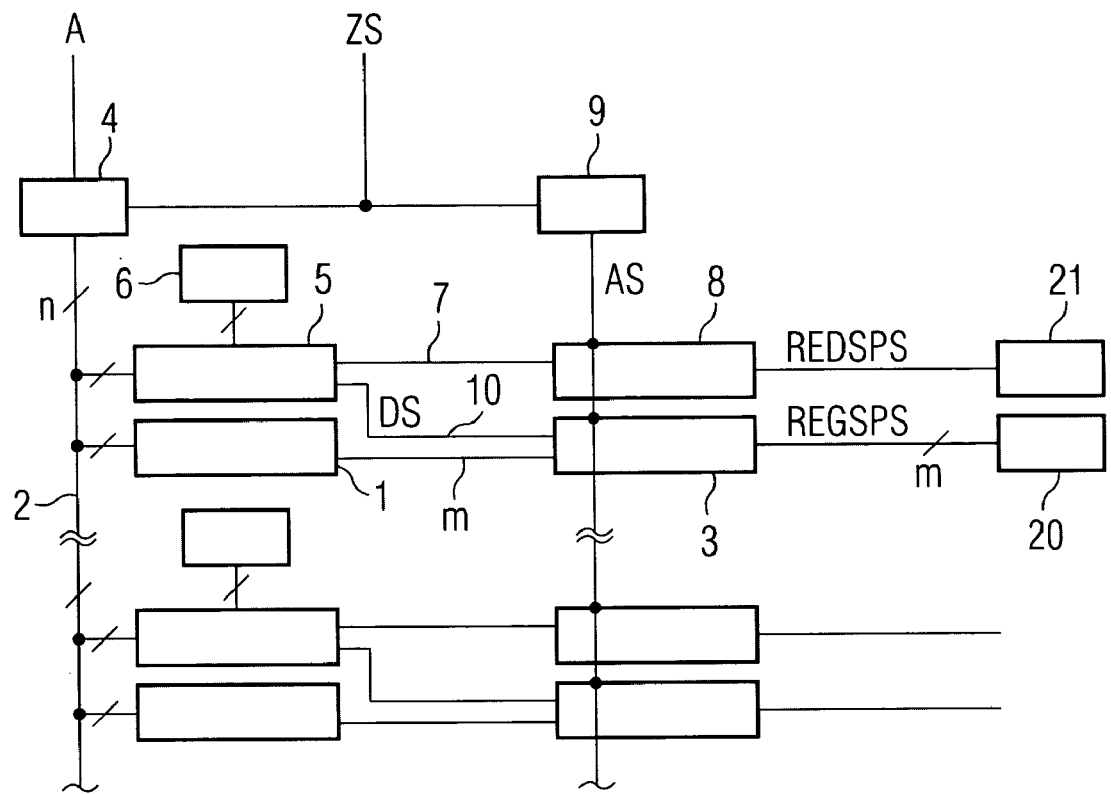
FIG. 1 shows an integrated memory circuit with an address decoding circuit according to the prior art.

FIG. 1 shows a block diagram of a detail of an integrated memory circuit according to the prior art. The detail shows an address decoding circuit, by means of which both regular memory areas 20 and redundant memory areas 21 in a memory cell array (not shown) can be addressed.

The address A is applied to the address bus 2 via a buffer 4, with an access signal ZS being provided in order to accept an address, which is applied to the buffer 4, on the address bus 2. The number of address input lines to the buffer 4 corresponds to the number n of address lines in the address bus 2.

A first decoding circuit 1 is provided, and is connected to address lines in an address bus 2. The address bus has a number n of address lines to apply the address A to be decoded in parallel to the first decoding circuit. The first decoding circuit 1 has, at appropriate outputs, a second number of memory area control lines for transmission of memory area control signals SPS, which are each driven via a first driver circuit 3, which may be in the form of a latch, to the respective memory area as a regular memory area signal REGSPS, in order to address the memory area which is associated with the respective output of the first decoding circuit 1. The second number m of memory area control lines corresponds to the number of regular memory areas 20 which can be addressed via the address A with the aid of the first decoding circuit 1.

A second decoding circuit 5 is connected to the address bus 2. The second decoding circuit 5 is connected to a fuse memory 6, which provides the second decoding circuit 5 with a coded address. The decoded address is stored in the fuse memory 6 by means of a writing process. If the fuse memory 6 has laser fuses, then their state is changed or not changed with the aid of a laser trimming process, so that it is possible to write a coded address A. Other memory elements may also be provided for this purpose instead of the laser fuses, for example, so-called E fuses, which can be changed from a non-conductive state to a conductive state with the aid of an electrical current.

The second decoding circuit 5 compares the address A that is applied on the address bus 2 with the coded address in the fuse memory 6 and applies an appropriate memory area control signal SPS (which activates a redundant memory area 21 associated with the second decoding circuit 5) to a redundant control line 7, when the redundant memory area 21 which is associated with the second decoding circuit 5 is intended to be addressed. The corresponding memory area control signal is applied to a second driver circuit 8, which produces a redundant memory area signal REDSPS. The first and second driver circuits 3, 8 are used to drive the respective signals on the memory area control lines and on the redundant control line 7 to the appropriate memory areas 20, 21.

The first and second driver circuits 3, 8 furthermore have the function of applying the memory area control signals SPS from the first and second decoding circuits 1, 5 to the relevant memory areas, 20, 21 as the signals REGSPS and REDSPS respectively, at a predetermined point in time. For this purpose, the first and second driver circuits 3, 8 are controlled with the aid of an activation signal AS such that the applied memory area control signal SPS is passed on to the respective memory area 20, 21 only when the activation signal AS indicates this.

The activation signal AS is generated from the access signal ZS with the aid of a delay unit 9. The delay unit 9 causes the activation signal AS not to be applied to the first or to the second driver circuit 3, 8, respectively, until the respective memory area control signal is undoubtedly present at the respective input of the first or second driver circuit, 3, 8, respectively. Since the first and second decoding circuits 1, 5 each have a signal delay which is produced from the signal delay time at the respective inputs of the first and second decoding circuits 1, 5, the access signal must be delayed by at least the time which is required for the respective memory area control signal SPS to be applied to the input of the first or second driver circuit 3, 8.

When an address A which is programmed as a coded address in the fuse memory 6 is applied to the address bus 2, then it is necessary to preclude the possibility of the first decoding circuit 1 also addressing the relevant regular memory area 20 in addition to the redundant memory area 21 which is addressed by the second decoding circuit 5. This is achieved by providing a deactivation signal DS on a deactivation line 10 of the first driver circuit 3 from the second decoding circuit 5, which indicates whether the memory area control signal which is being applied to the input of the corresponding first driver circuit 3 should be passed onto the memory area 20, or should be blocked, for the addressed regular memory area 20. If the address on the address bus 2 corresponds to the coded address, then addressing of the regular memory area which is associated with this address is blocked by the deactivation signal DS.

In general, the generation of the deactivation signal DS represents a critical path with respect to the signal delay time. That is to say, the generation of the deactivation signal DS requires a considerably longer time period than the provision of the memory area control signals SPS for the driver circuits 3, 8. The delay element 9 must therefore be set such that the activation signal AS for the driver circuits 3, 8 is applied to the driver circuits 3, 8 after the production of the appropriate deactivation signal DS.

Figure 2:
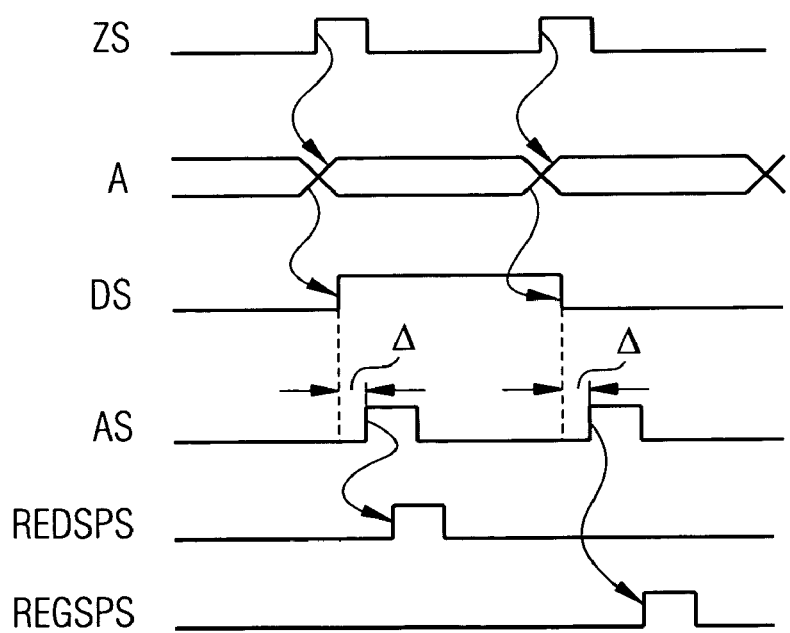
FIG. 2 shows a signal timing diagram for the integrated memory circuit shown in FIG. 1.

FIG. 2 shows a signal timing diagram illustrating the signal delay times in the address decoding circuit as shown in FIG. 1. As shown, once the applied address A has been transferred to the buffer 4 on the basis of the access signal, the deactivation signal DS is generated with a specific delay, which is dependent on the delay time. The high level of the deactivation signal DS indicates that the applied address is intended to address a redundant memory area. This is, of course, true only when the address A on the address bus 2 is selected by means of the coded address in the fuse memory 6, so that the address A is intended to address a redundant memory area. The memory area control signal SPS on the redundant control line 7, which is generated essentially at the same time as the deactivation signal DS, is then applied to the input of the second driver circuit 8. It is not permissible to allow the activation signal AS to be passed on to the relevant driver circuit 3, 8 until the relevant signals have been applied to the inputs of the first and second driver circuits 3, 8. This activation signal AS must be delayed by a delay time ΔT with respect to the deactivation signal, in order to comply with the respective set-up time of the driver circuits 3, 8. This results in a delay time which must be set in the delay element 9, from the signal delay time of the address A through the second decoding circuit 5 to the first driver circuit 3, and through the set-up time of the driver circuits 3, 8.

The relevant redundant memory area signal REDSPS and the regular memory area signal REGSPS are then activated in accordance with the activation signal AS to address the respectively addressed regular memory area 20 or redundant memory area 21. The delay time that is set in the delay element 9 is thus governed essentially by the signal delay time through the second decoding circuit 5.

Since the signal delay times are critical for the provision of the deactivation signal DS both in the case of a rising edge and in the case of a falling edge, the signal delay times in the second decoding circuit 5 must be optimized both with respect to the rising edge and with respect to the falling edge. Since the second decoding circuit 5 is formed essentially from logic gates, the signal delay time can be set by varying the fan-in and fan-out, that is to say the respective input loads and driver levels of the transistors that are used.

Figure 3:
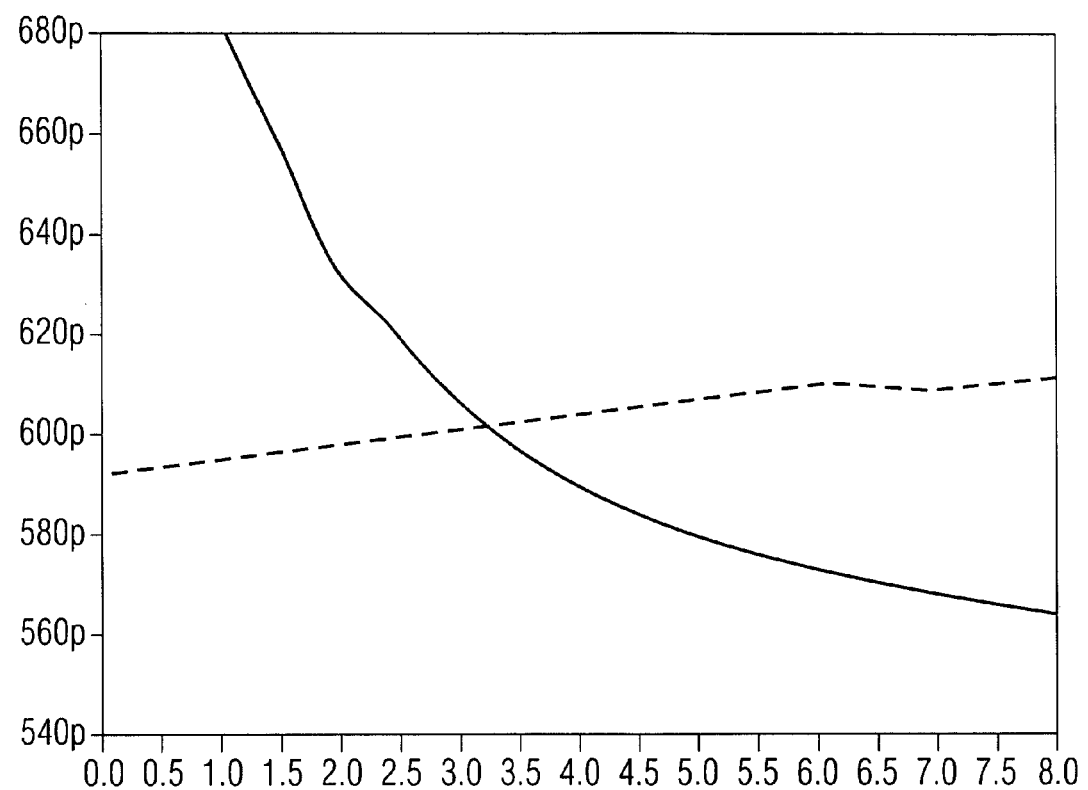
FIG. 3 shows a diagram of the signal delay time of a falling edge and of a rising edge by means of a logic circuit, plotted over the width of the n-FET which is used in the logic gates.

FIG. 3 shows how the signal delay time of a rising edge and of a falling edge changes through a number of logic gates when the width of the channel of the n-FETs in the logic gates is varied. The dashed graph represents the change in the signal delay time for a rising edge, i.e., a rising edge at the input of the logic circuit is delayed by the corresponding delay as plotted on the y axis, while a falling edge, represented by the solid-line graphs, is likewise delayed on the basis of the delay indicated on the y axis. The channel width is plotted in micrometers on the x axis. As shown, as the channel width of the n-FETs increases, the signal delay time of the falling edge decreases sharply, while the signal delay time of the rising edge does not change to a major extent.

A logic circuit may be optimized with respect to the parameters of the logic gates which are used such that the signal delay time is optimized either with respect to a rising edge or with respect to a falling edge. For example, if it is assumed that a low level of the deactivation signal DS does not block the addressing of the corresponding regular memory area 20 and that a high level of the deactivation signal DS does block the regular memory area 20, then a rising edge is generated when an address by means of which a redundant memory area is addressed is applied. If, for example, the second decoding circuit 5 is then optimized only with respect to the rising edge, and the activation signal AS is adapted appropriately, then it is possible for the falling edge of the deactivation signal to be applied to the first driver circuit 3 later, owing to the longer signal delay time, as compared to the activation signal from the delay element 9. This would result in the addressing of the addressed regular memory area 20 being prevented in the subsequent address access, even though this is not intended to be replaced by a redundant memory area 21.

Embodiments of the invention provide that, on the basis of this example, the falling edge of the deactivation signal DS is delayed such that, when the delay time is set in the delay element 9, all that needs to be taken into account is the signal delay time with respect to the rising edge in the second decoding circuit 5. For this purpose, a control signal may be utilized to ensure that the deactivation signal DS is reset before the next address is applied to the address bus 2, but in any case, before the respective memory area control signal SPS is applied to the appropriate input of the first driver circuit 3 for the next address. At the same time, the second decoding circuit 5 is designed such that the logic gates which are used in it are optimized with respect to their signal delay time of a rising edge of the deactivation signal. The falling edge of the deactivation signal is ignored in this optimization process. Furthermore, the delay element 9 is set such that the delayed access signal ZS is made available to the driver circuits 3, 8 as the activation signal AS, as early as possible. The delay time may correspond to the signal delay time of the rising edge of the deactivation signal DS through the second decoding circuit 5 plus the set-up time for the first driver circuit 3.

Figure 4:
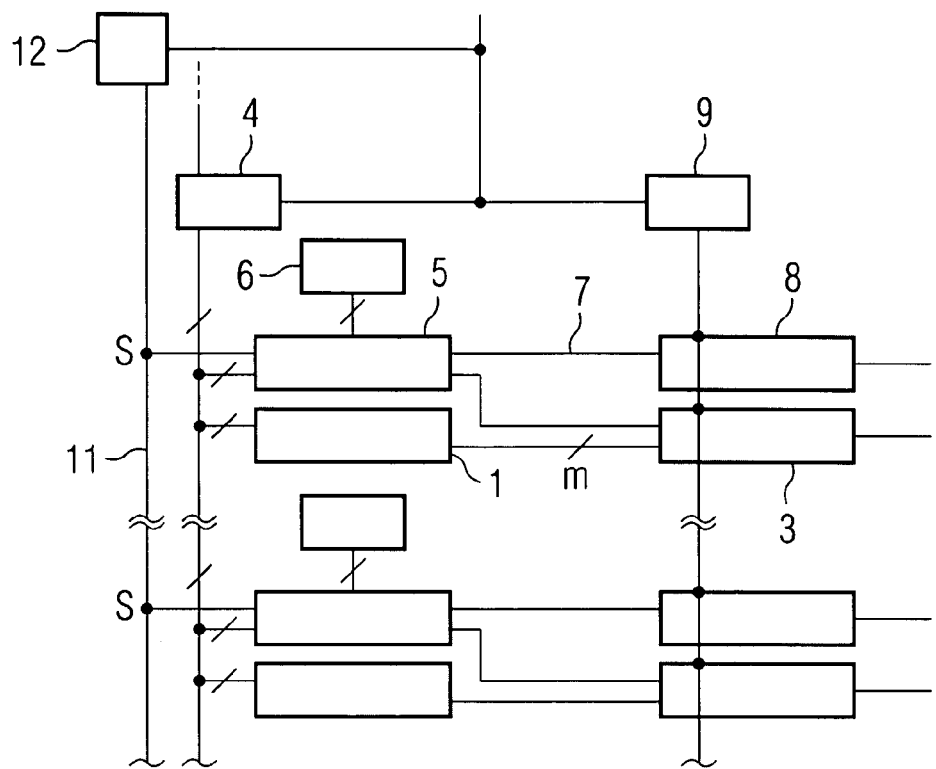
FIG. 4 shows a block diagram of a detail of an integrated memory circuit according to a first embodiment of the invention.

To reset the deactivation signal DS at an earlier time (i.e., to change it back to the low state) than the typical time in the case as a result of the corresponding evaluation of the address A applied to the address bus 2, a control signal is applied to the decoding circuit. This may be done, for example, via a further address line 11, as is illustrated in FIG. 4. Elements with the same reference symbols have essentially the same function as those already described in conjunction with FIG. 1.

The control signal is provided to the second decoding circuit 5 from an appropriate control circuit 12 via the address line. The control circuit 12 furthermore generates the access signal ZS, so that the timings of the access signal ZS and of the control signal S on the address line 11 can be matched.

Particularly in the case of a DDR-11 memory module, two successive addresses are not addressed at an interval of one clock period, but at an interval of at least two clock periods. While, by way of example, the address A is applied to the address bus 2 with a corresponding edge of every alternate clock period, it is then possible to use the corresponding edges of the intermediate clock periods to generate a control signal, which reset any possibly activated deactivation signal DS, that is to say for example reset this deactivation signal DS is in a high state, before the next address A is applied to the address bus 2. The deactivation signal DS is thus always reset with sufficient time before the application of the next memory area control signal SPS to one of the driver circuits 3, 8.

The control signal S can also be produced in some other way in the control circuit 12. The only essential feature is that the control signal leads to the deactivation signal DS being reset with sufficient time to prevent accidental blocking (or accidental non-blocking) of the addressing of a regular memory area 20 by the first driver circuit 3.

Figure 5:
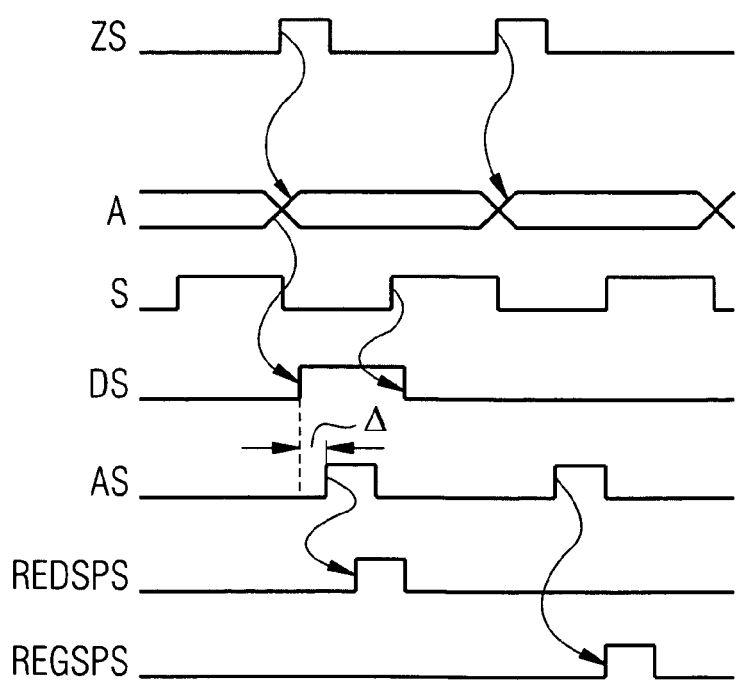
FIG. 5 shows a signal timing diagram illustrating the signal profiles in the integrated memory circuit as shown in FIG. 4.

FIG. 5 shows a corresponding signal timing diagram. As shown, the control signal S acts on the rising edge (represented by an arrow) by resetting the deactivation signal DS (e.g., setting it to the low state). When the next address A is applied to the address bus 2, the deactivation signal DS is thus in the low state once again, so that the second decoding circuit 5 can once again determine whether the deactivation signal DS should be set to a high state when the intention is to address a redundant memory area 21.

In the illustrated signal timing diagram, the rising edge of the control signal S which causes the deactivation signal DS to be reset is located approximately in the center between the rising edges of the access signal ZS. However, this is not essential. It is sufficient for the rising edge of the control signal S (i.e., the active edge) to be applied in a time period which is determined by the memory area control signal SPS having been driven onto the respective memory area control line in accordance with the most recently applied address, and by the time period after which the optimized activation signal AS according to embodiments of the invention activates the corresponding driver circuit to drive the respective memory area control signal SPS for the next address.

Figure 6:
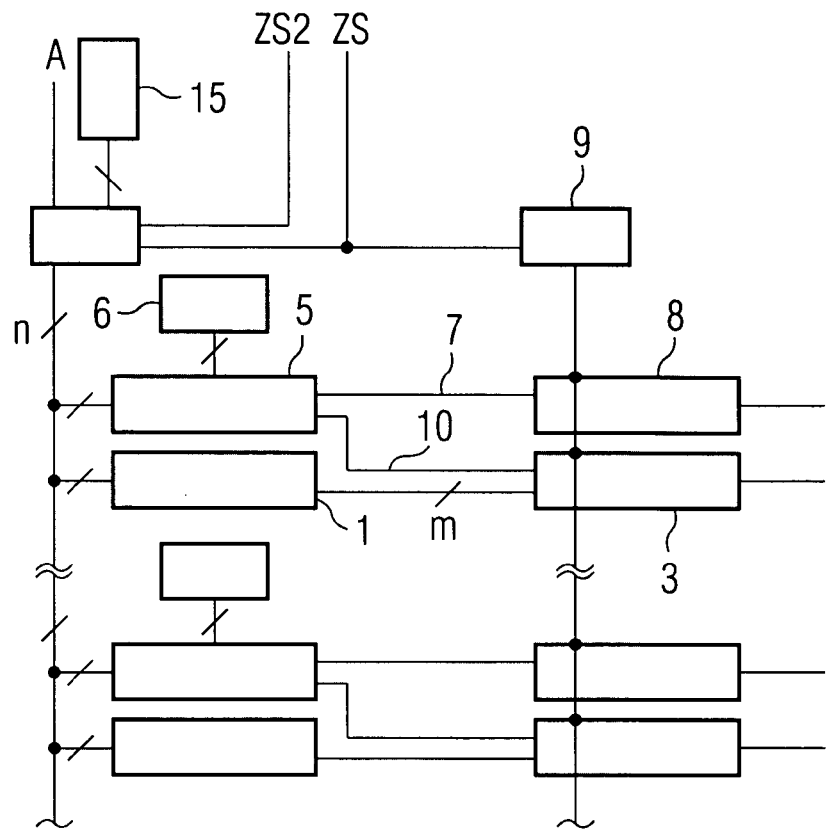
FIG. 6 shows a block diagram of a detail of an integrated memory circuit according to a second embodiment of the invention.

FIG. 6 shows a further embodiment of the present invention. In contrast to the configuration according to the prior art described so far, the buffer 4 is designed such that an applied address A is applied to the data bus 2 on the basis of the access signal ZS. An address value which has been coded in a further fuse memory 15 is read to the buffer 4 and is applied to the data bus 2 on the basis of a further access signal ZS2, which can likewise be applied to the buffer 4. The coded address value in fuse memory 15 is selected such that it does not respond to an address A whose aim is to address a redundant memory area 21. As soon as the second decoding circuit 5 identifies the address value, which has been coded on the data bus 2 and which is stored in the further fuse memory 15, the deactivation signal DS is reset in a corresponding manner. In order to achieve resetting before the application of the next address, the further access signal ZS2 is made available in good time such that it applies an active edge between the application of the two successive addresses to the buffer 4.

In this embodiment, the control signal for the existing second decoding circuits in the memory circuit may be provided utilizing one address line (i.e., without needing an additional address line). The already available address bus 2 is used to apply a coded address value, which is not coded in any of the associated fuse memories 6 of the respective second decoding circuits 5 as an address for addressing of a redundant memory area. The generation of the further access signal ZS2 is generated, for example as in the case of the previous exemplary embodiment, such that the deactivation signal DS is applied to the driver circuits 3, 8 significantly before the application of the next address, and in any case before the application of the activation signal AS.

The exemplary embodiment shown in FIG. 6 requires that a further fuse memory 15 be provided, which has to be programmed after the process of manufacturing the integrated memory circuit. The fuse memory 15 is programmed such that it contains an address which is not coded in any of the fuse memories 6 for the second decoding circuit 5. This results in an address value being applied to the address bus 2 by means of the further access signal ZS2, setting the deactivation signal DS to a state in which the addressing of the regular memory areas 20 is not blocked.

Figure 7:
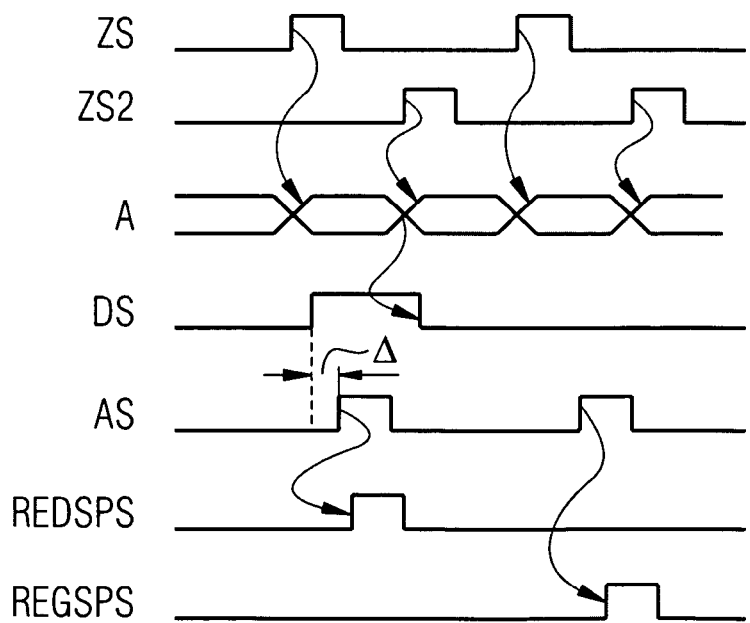
FIG. 7 shows a signal timing diagram illustrating the signal profiles in the integrated memory circuit shown in FIG. 6.

FIG. 7 shows the signal profiles of the memory circuit with the address decoding circuit as shown in FIG. 6. As shown, the deactivation signal DS is reset on the basis of the further access signal ZS2 and on the basis of the coded address value which is applied to the address bus in consequence. In this case as well, the further access signal ZS2 may be generated in a DDR memory circuit from the clock signal, since a new address A may be applied to the address bus at most in every alternate clock period.

The exemplary embodiments described above indicate that a high state of the deactivation signal DS blocks the addressing of the regular memory area while a low state of the deactivation signal allows the addressing of the regular memory area 20. The deactivation signal DS may also be provided as a low-active signal such that the signal levels are interchanged.

What is claimed is:

1. A method for addressing memory areas in a memory circuit, the memory circuit having a regular memory area and a redundant memory area, comprising:
    addressing the regular memory area when a deactivation signal is in an inactive state;
    when the redundant memory area is to be addressed, activating the deactivation signal to an active state to block addressing of the regular memory area; and
    changing the deactivation signal from the active state to the inactive state before an application of a next address for addressing one of the memory areas.

2. The method of claim 1, wherein the regular and redundant memory areas are selectively addressed based on a driven memory area control signal generated as a function of a first access signal and the deactivation signal.

3. The method of claim 2, further comprising:
    providing a control signal to change the deactivation signal from the active state to the inactive state.

4. The method of claim 3, wherein the control signal includes a first signal edge and a second signal edge, wherein the first signal edge indicates a point in time before the application of the next address and the second edge corresponds to an activation edge of the first access signal, and wherein the deactivation signal is changed from the active state to the inactive state corresponding to the first edge.

5. The method of claim 4, wherein the first edge is a rising edge and the second edge is a falling edge, and wherein a decoding circuit comprises logic circuits selected to reduce signal delays through the decoding circuit with respect to the rising edge of the deactivation signal.

6. The method of claim 3, wherein the memory area is addressed with a clock edge selected from one of every rising clock edge and every falling clock edge while no memory area is addressed as a function of an intermediate clock edge, and wherein the control signal is generated as a function of the intermediate clock edge.

7. The method of claim 3, wherein the control signal is generated by a comparison between a coded defect address and a defined non-defect address according to a second access signal, wherein the first access signal and the second access signals are offset with respect to each other.

8. The method of claim 1, wherein the change from the active state of the deactivation signal to the inactive state of the deactivation signal is carried out approximately in a middle of a time period between addressing of two successive addresses.

9. An integrated circuit having an address decoding circuit for selectively addressing a regular memory area and a redundant memory area, the address decoding circuit comprising:
    an address data input for receiving an address data;
    an address memory for storing of a defect address data;
    a first output for outputting a redundant memory area control signal for addressing the redundant memory area when the received address data is identical to the defect address data;
    a second output for outputting a deactivation signal for blocking addressing of the regular memory area in an active state and allowing addressing of the regular memory area in an inactive state; and
    a control signal input for receiving a control signal for changing the deactivation signal from an active state to an inactive state before an application of a next address for addressing one of the memory areas.

10. The integrated circuit of claim 9, wherein the address decoding circuit comprises logic circuits selected to reduce signal delays through the address decoding circuit with respect to one of a falling edge of the deactivation signal, when the inactive state of the deactivation signal is a high state and the active state of the deactivation signal is a low state, and a rising edge of the deactivation signal, when the inactive state of the deactivation signal is a low state and the active state of the deactivation signal is a high state.

11. The integrated circuit of claim 9, further comprising:
    a control circuit connected to provide the control signal to the address decoding circuit.

12. The integrated circuit of claim 9, further comprising:
    a buffer connected to apply the address to the address data input based on a first access signal.

13. The integrated circuit of claim 12, further comprising:
    a second address memory connected to the buffer, the second address memory storing a predetermined coded address, wherein the buffer applies the predetermined coded address to the address decoding circuit based on a second access signal, wherein the deactivation signal is changed from the active state to the inactive state on application of the predetermined coded address to the address data input of the address decoding circuit.

14. The integrated circuit of claim 13, wherein the first and the second access signals are generated based on a clock signal, the first and the second access signals being provided at intervals of two clock periods, with an offset of one clock period with respect to each other.

15. An integrated circuit having an address decoding circuit for selectively addressing a regular memory area and a redundant memory area, the address decoding circuit comprising:
   an address data input means for receiving an address data;
   an address memory means for storing of a defect address;
   a first output means for outputting a redundant memory area control signal for addressing the redundant memory area when the received address data is identical to the defect address data;
   a second output means for outputting a deactivation signal for blocking addressing of the regular memory area in an active state and allowing addressing of the regular memory area in an inactive state; and
   a control signal input means for receiving a control signal for changing the deactivation signal from an active state to an inactive state before an application of a next address for addressing one of the memory areas.

16. The integrated circuit of claim 15, further comprising:
   a control circuit means for providing the control signal to the address decoding circuit.

17. The integrated circuit of claim 16, further comprising:
   a buffer means connected to apply the address data to the address data input based on a first access signal.

18. The integrated circuit of claim 17, further comprising:
   a second address memory means connected to the buffer means, the second address memory storing a predetermined coded address, wherein the buffer means applies the predetermined coded address to the address decoding circuit means based on a second access signal, wherein the deactivation signal is changed from the active state to the inactive state on application of the predetermined coded address to the address data input means of the address decoding circuit.

19. The integrated circuit of claim 18, wherein the first and the second access signals are generated based on a clock signal, the first and the second access signals being provided at intervals of two clock periods, with an offset of one clock period with respect to each other.

20. The integrated circuit of claim 15, wherein the address decoding circuit comprises logic means selected to reduce signal delays through the address decoding circuit means with respect to one of a falling edge of the deactivation signal, when the inactive state of the deactivation signal is a high state and the active state of the deactivation signal is a low state, and a rising edge of the deactivation signal, when the inactive state of the deactivation signal is a low state and the active state of the deactivation signal is a high state.

* * * * *